United States Patent
Lin et al.

(10) Patent No.: US 6,784,077 B1
(45) Date of Patent: Aug. 31, 2004

(54) SHALLOW TRENCH ISOLATION PROCESS

(75) Inventors: Shih-Chi Lin, Taipei (TW); Chih Chung Lee, Taichung (TW); Guey Bao Huang, Hsin-Chu (TW); Szu-An Wu, Hsin-Chu (TW); Ying Lang Wang, Tai-Chung (TW); Chun Chun Yeh, Hsin-Chu (TW)

(73) Assignee: Taiwan Semiconductor Manufacturing Co. Ltd., Hsin-Chu (TW)

( * ) Notice: Subject to any disclaimer, the term of this patent is extended or adjusted under 35 U.S.C. 154(b) by 0 days.

(21) Appl. No.: 10/270,973

(22) Filed: Oct. 15, 2002

(51) Int. Cl.$^7$ ................................ H01L 21/76
(52) U.S. Cl. ................ 438/426; 438/404; 438/699; 438/703; 438/723; 438/724; 438/778; 438/787; 438/791
(58) Field of Search ................. 438/404, 424, 438/425, 426, 430, 435, 694, 696, 699, 700, 701, 702, 703, 723, 724, 778, 787, 971, 978, FOR 167, FOR 221, FOR 222, FOR 227

(56) References Cited

U.S. PATENT DOCUMENTS

| | | | | |
|---|---|---|---|---|
| 6,037,238 A | * | 3/2000 | Chang et al. | 438/426 |
| 6,080,627 A | * | 6/2000 | Fan et al. | 438/270 |
| 6,080,637 A | * | 6/2000 | Huang et al. | 438/424 |
| 6,251,746 B1 | * | 6/2001 | Hong et al. | 438/424 |
| 6,326,282 B1 | * | 12/2001 | Park et al. | 438/424 |
| 6,331,472 B1 | * | 12/2001 | Liu et al. | 438/424 |
| 6,576,530 B1 | * | 6/2003 | Chen et al. | 438/435 |
| 6,613,646 B1 | * | 9/2003 | Sahota et al. | 438/424 |
| 2003/0143854 A1 | * | 7/2003 | Chen et al. | 438/700 |

* cited by examiner

*Primary Examiner*—George Fourson
*Assistant Examiner*—Joannie Adelle Garcia
(74) *Attorney, Agent, or Firm*—Duane Morris LLP

(57) ABSTRACT

A method of forming a silicon oxide, shallow trench isolation (STI) region, featuring a silicon rich, silicon oxide layer used to protect the STI region from a subsequent wet etch procedure, has been developed. The method features depositing a silicon oxide layer via PECVD procedures, without RF bias, using a high silane to oxygen ratio, resulting in a silicon rich, silicon oxide layer, located surrounding the STI region. The low etch rate of the silicon rich, silicon oxide layer, protect the silicon oxide STI region from buffered hydrofluoric wet etch procedures, used for removal of a dioxide pad layer.

21 Claims, 5 Drawing Sheets

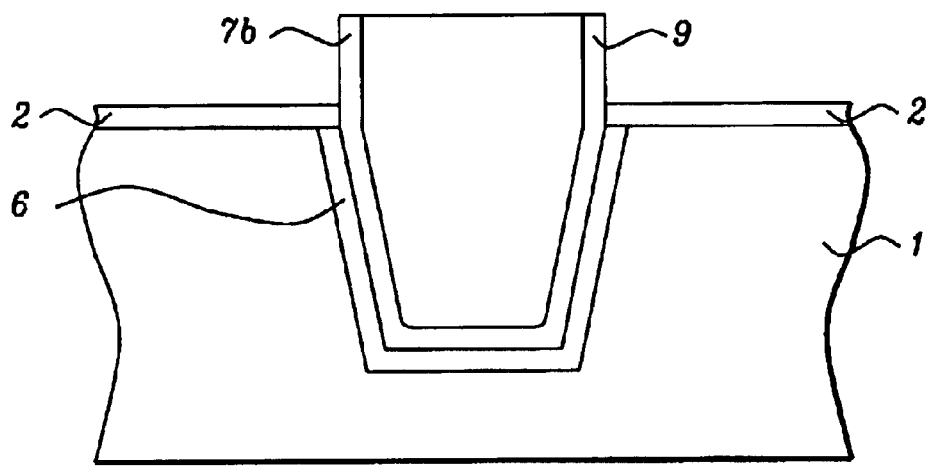
FIG. 9
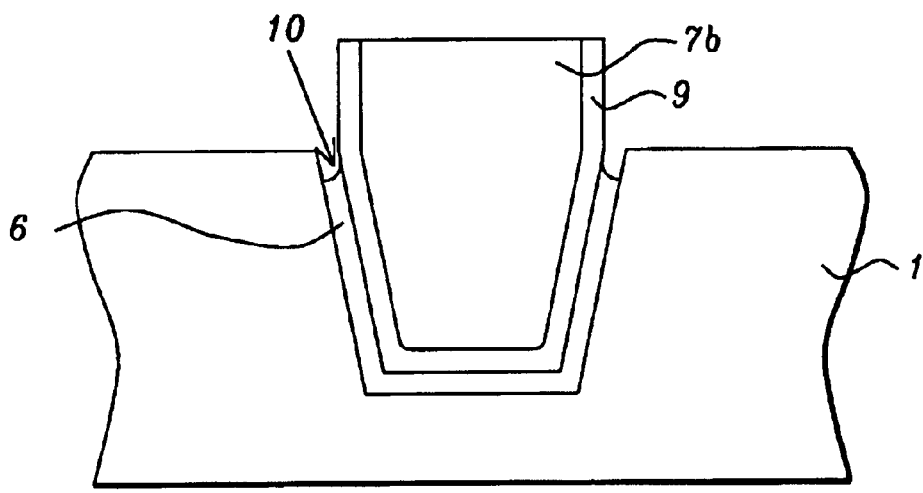
FIG. 10
Wet Etch Rate Comparision
|  | $O_2/SiH_4$ Ratio | Refractive Index | Etch Rate in 10:1 BHF |
|---|---|---|---|
| Thermal Oxide | 3.83 | 1.46 | 1159 |
| Si Rich Oxide | 1.37 | 1.66 | 800 |
FIG. 11

US 6,784,077 B1

SHALLOW TRENCH ISOLATION PROCESS

BACKGROUND OF THE INVENTION (1) Field of the Invention

The present invention relates to methods used to fabricate semiconductor devices, and more specifically to a method used to fabricate a shallow trench isolation (STI), region in a semiconductor substrate.

(2) Description of Prior Art

Insulator regions are used to provide electrical, as well as physical isolation between devices, and device regions, on a semiconductor substrate. One method of providing isolation is via formation of regions of localized oxidation of silicon (LOCOS). This procedure employs an oxidation resistant mask such as silicon nitride, to protect subsequent active device regions from LOCOS, while regions not covered by the oxidation resistant mask are subjected to the thermal oxidation procedure resulting in the formation of LOCOS or field oxide (FOX), isolation regions. However the journey to micro-miniaturization, or the ability to fabricate semiconductor devices with sub-micron features, have led the industry to alternative methods for forming isolation regions. The LOCOS procedure allows unwanted oxidation of semiconductor to result at the edges of the oxidation resistant, or silicon nitride masking shape, resulting in a thin silicon oxide layer, sometimes referred to "birds beak", protruding under the oxidation resistant masks into the designed active device region. The consequence of the "birds beak" phenomena is larger than desired active device region designs, needed to accommodate the unwanted "birds beak" growth. This results in larger semiconductor chips which adversely impact device performance, as well as fabrication costs.

The use of STI technology eliminates the possibility of "birds beak" formation, and thus is extensively used with the advent of micro-miniaturization. The use of dry etched defined trenches in the semiconductor substrate, followed by insulator filling and removal of excess insulator layer, allow isolation regions to be formed, satisfying all the design demands of micro-miniaturization. To insure isolation integrity, in terms of surface states and charge, a thermally grown, silicon dioxide layer is sometimes formed as a liner layer, on the exposed surfaces of the trenches, as well as on the top sure of the semiconductor substrate, prior to filling of these same trenches with chemically vapor deposited insulator layer. However removal of a pad oxide layer from the top surface of the semiconductor substrate to expose a subsequent active device region, performed via wet etch procedures after formation of the STI regions, can result in unwanted etching of the liner layer, and of the adjacent STI region. The vulnerable regions, located at the corners of the STI regions, are exposed to the pad oxide layer, wet etch removal procedure, sometimes resulting in significant insulator removal. The removed oxide region or "ditch" can be a source for trapped contaminants, introduced during subsequent processing procedures, or the "ditch" can be a region where unwanted surface states can be initiate from.

This invention will describe a process for forming an STI region in a semiconductor substrate, featuring an additional insulator layer deposited overlying the liner layer. The additional insulator layer features a low etch rate in the solutions used to remove the pad oxide layer, thus offering protection to the oxide liner layer, and the oxide filled trenches during the pad oxide removal procedure. Prior art, such as Jang et al, in U.S. Pat. No. 6,239,002, as well Lee in U.S. Pat. No. 5,933,749, describe methods of forming STI regions in a semiconductor substrate, however those prior arts do not describe the key feature, the protective overlying insulator layer, offered in this present invention.

SUMMARY OF THE INVENTION

It is an object of this invention to form shallow trench isolation (STI), regions in top portions of a semiconductor substrate.

It is another object of this invention to form a thermally grown, silicon dioxide liner layer on the exposed surfaces of the shallow trench shapes.

It is still another object of this invention to deposit a silicon rich, silicon oxide layer, on the silicon dioxide liner layer, prior to filling the trench shapes with an insulator layer.

In accordance with the present invention a method of forming STI regions in a semiconductor substrate, featuring a silicon rich, silicon oxide layer deposited on an underlying silicon dioxide liner layer, and used to prevent removal of regions of the silicon dioxide liner layer, during subsequent wet etch procedures, is described. After definition of shallow trench shapes in a composite insulator layer comprised of an overlying silicon nitride layer, and an underlying silicon dioxide pad layer, the dry etching definition procedure is continued to form the shallow trench shapes in top portions of a semiconductor substrate. A silicon dioxide liner layer is thermally grown on the exposed semiconductor surfaces of the shallow trench shapes. A silicon rich, silicon oxide layer, is next deposited, followed by insulator filling of the shallow trench shapes. A chemical mechanical polishing (CMP) is used to remove portions of the insulator fill layer, as well as the portions of the silicon rich, silicon oxide layer, from the top surface of the silicon nitride surface, resulting in the desired STI regions. Selective removal of silicon nitride, via wet etch procedures, is followed by removal of the silicon dioxide pad oxide layer. The low etch rate of the silicon rich, silicon oxide, in the wet etchant used to remove the silicon dioxide pad layer, allowed this layer to survive, and thus protect the insulator fill layer, as well as the silicon dioxide liner layer, located in the STI regions, during this wet etch procedure.

BRIEF DESCRIPTION OF THE DRAWINGS

The object and other advantages of this invention are best described in the preferred embodiment, with reference to the attached drawings that include:

FIGS. 1–10, which schematically, in cross-sectional style, describe key stages of fabrication employed to form STI regions in a semiconductor substrate, featuring a silicon rich silicon oxide layer, used to protect the insulator fill layer, and the silicon dioxide liner layer, during subsequent wet etch procedures.

FIG. 11, which in a table format compares the wet etch rate of the protective, silicon rich silicon oxide component, to thermally grown silicon dioxide.

DESCRIPTION OF THE PREFERRED EMBODIMENTS

Figure 1:
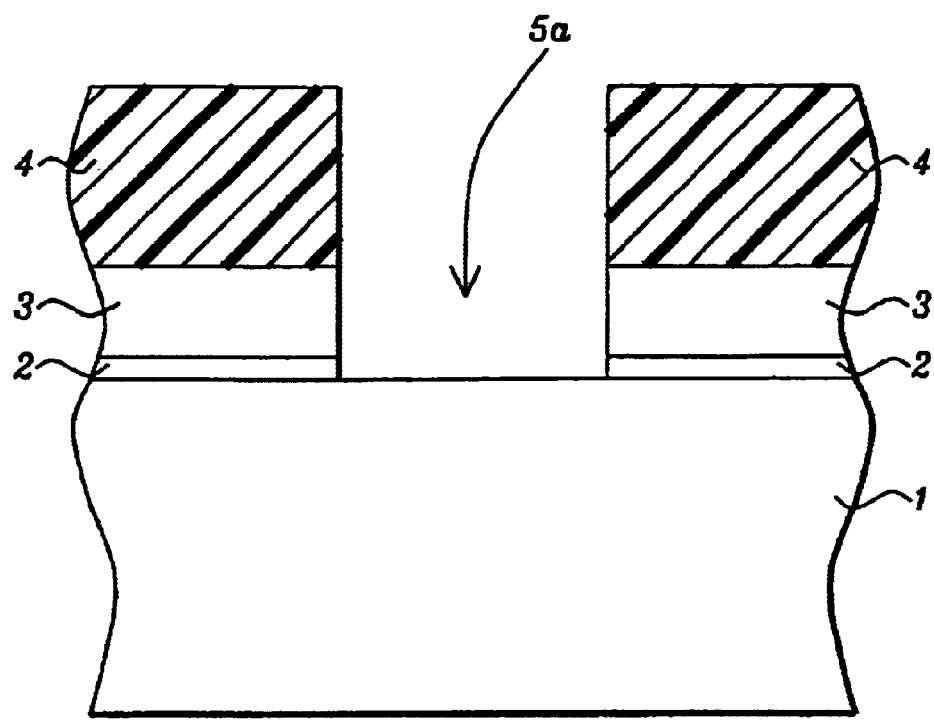

The method of forming shallow trench isolation (STI) regions in a semiconductor substrate, featuring a silicon rich silicon oxide layer, used to protect the STI insulator fill layer, as well as the silicon dioxide liner layer, during subsequent wet etch procedures, will now be described in detail. A P type semiconductor substrate 1, comprised of single crystalline silicon with a <100>crystallographic orientation, is used and schematically shown in FIG. 1. Silicon dioxide layer 2, to be used as a pad oxide layer, is thermally grown at a temperature between about 900 to 1000° C., in an oxygen-steam ambient, at a thickness between about 100 to 250 Angstroms, followed by deposition of silicon nitride layer 3, via low pressure chemical vapor deposition (LPCVD), or plasma enhanced vapor deposition (PECVD), procedures, at a thickness between about 1100 to 1700 Angstroms. Photoresist shape 4, is next formed and used as an etch mask allowing opening 5a, to be defined in the silicon nitride-silicon dioxide, composite insulator layer, via anisotropic, reactive ion etching (RIE), procedures, using $Cl_2$ or $CF_4$ as an etchant for silicon nitride layer 3, while $CHF_3$ is used as an etchant for silicon dioxide layer 2. Opening 5a, is defined with a diameter between about 0.15 to 0.30 um. The result of these procedures is schematically shown in FIG. 1.

Figure 2:
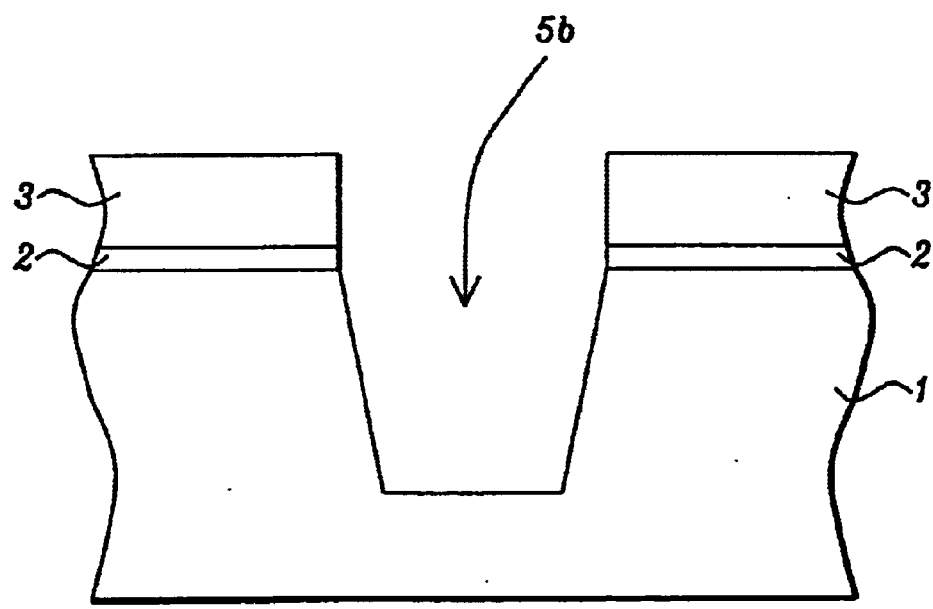

Photoresist shape is again used as an etch mask allowing opening 5b, to be formed in a top portion of semiconductor substrate 1, again via anisotropic RIE procedures, using $Cl_2$ or $SF_6$ as an etchant for silicon. Opening 5b, or shallow trench shape 5b, is formed to a depth between about 2500 to 5000 Angstroms, in semiconductor substrate 1. The anisotropic RIE procedure results in shallow trench openings with straight sidewalls. A second iteration of this invention is to increase the pressure of the RIE procedure from the anisotropic iteration to an isotropic iteration. The isotropic iteration, shown schematically in FIG. 2, results in a shallow trench shape with tapered sidewalls, at an angle between about 85 to 90°. The tapered shape reduces the difficulty for the subsequent filling of the shallow trench shapes with a chemically vapor deposited insulator layer. After definition of the shallow trench shape, photoresist shape 4, is removed via plasma oxygen ashing procedures.

Figure 3:
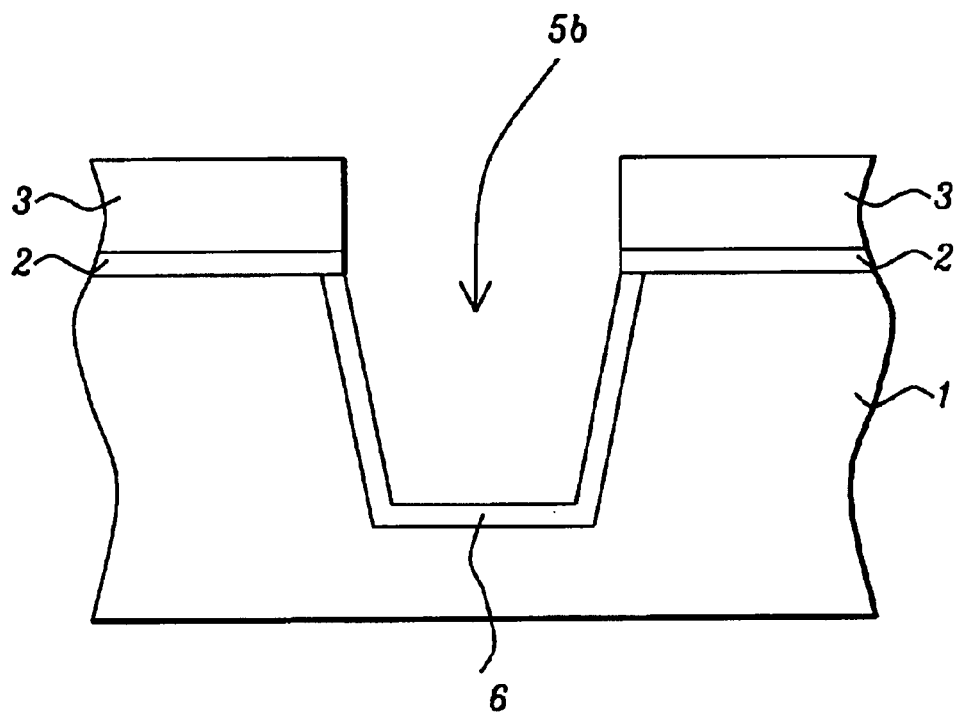
Figure 4:
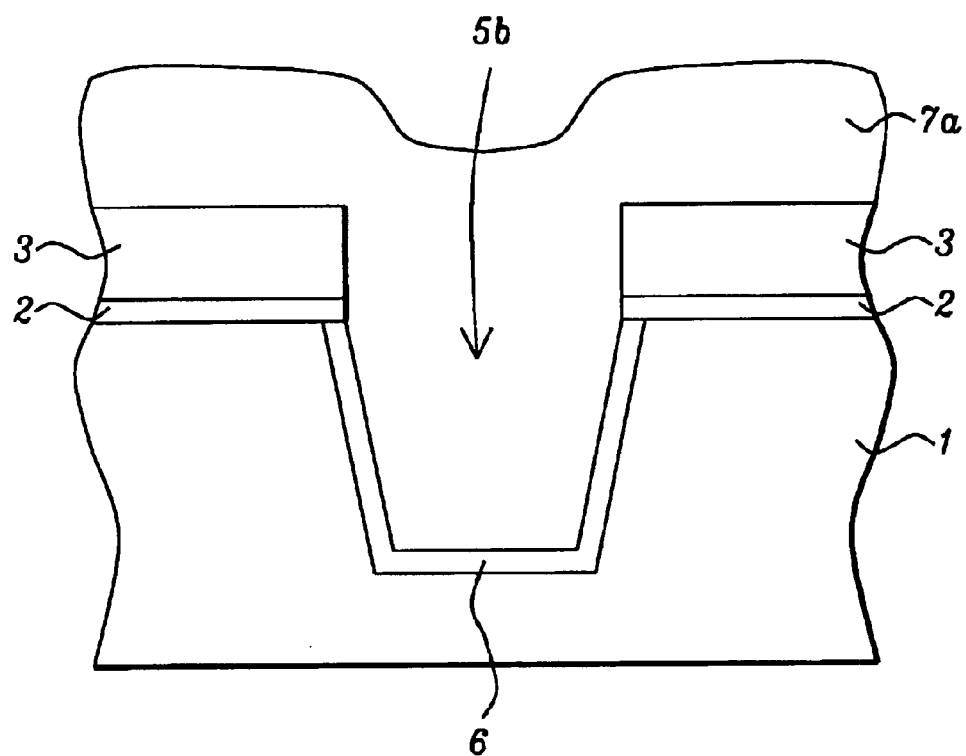
Figure 5:
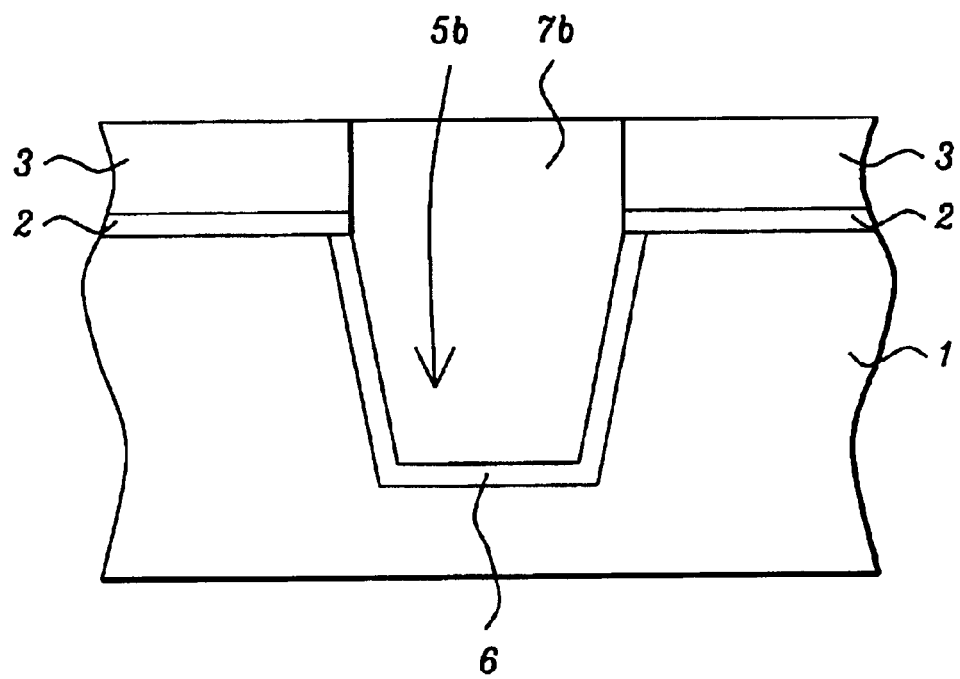

Prior to filling shallow trench shape 5b, with a chemically vapor deposited (CVD), insulator layer, a thin liner layer is first grown on the exposed surfaces of shallow trench shape 5b. Liner layer 6, schematically shown in FIG. 3, is a silicon dioxide layer, thermally grown in an oxygen-steam ambient, at a temperature between about 950 to 1100° C., at a thickness between about 100 to 300 Angstroms. Thermally grown, silicon dioxide layer 6, will offer improved passivation characteristics, in terms of insulator charge, dielectric breakdown strength and porosity, when compared to CVD silicon oxide counterparts, thus offering a less permeable layer interfacing subsequent active device regions, located adjacent to STI regions. Insulator layer 7a, comprised of silicon oxide, is next deposited via CVD procedures, to a thickness between about 5000 to 7000 Angstroms, completely filling shallow trench shape 5b. This is shown schematically in FIG. 4. A chemical mechanical polishing (CMP) procedure is then employed to remove the portions of silicon oxide layer 7a, located on the top surface of silicon nitride layer 3, resulting in STI region 7b, located in shallow trench shape 5b. This is schematically shown in FIG. 5.

Figure 6:
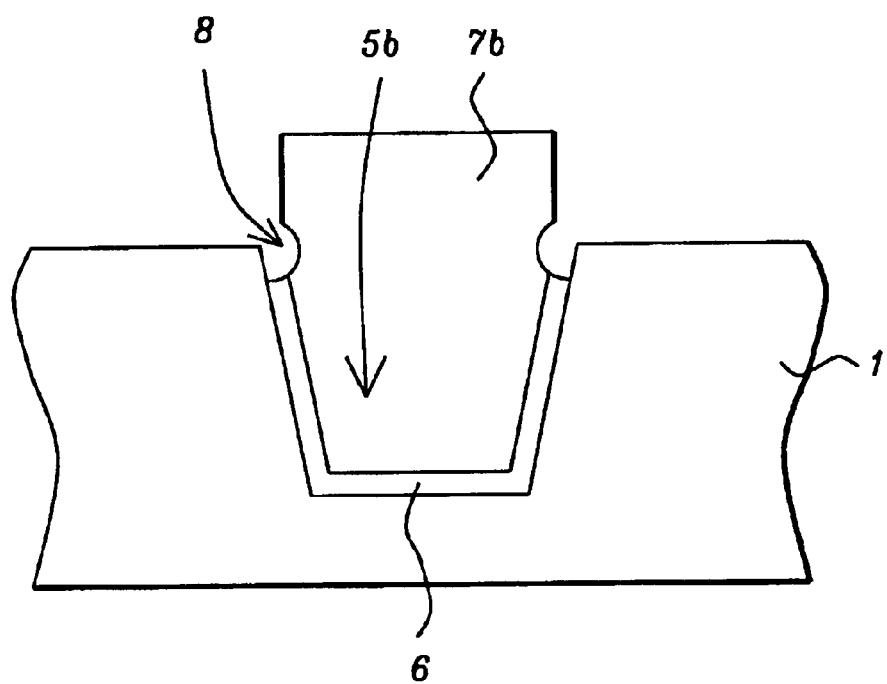

Removal of silicon nitride layer 3, is next addressed via use of a selective wet etch procedure employing a hot phosphoric acid solution. The removal of silicon dioxide pad layer 2, needed to expose a subsequent active device region is next addressed using a 50:1 buffered hydrofluoric acid (BHF), solution. However in addition to the desired removal of silicon dioxide layer 2, the BHF solution also results in undesired removal of exposed portions of silicon dioxide liner layer 6, as well as the removal of the portions of STI region 7b, now exposed by the etched portions of silicon dioxide liner layer 6. The undesired removal of portions of these layer, silicon dioxide liner layer 6, and STI regions 7b, result in "gouging" phenomena, or formation of "ditch" region 8, in an area of STI region 7b, located at the interface between the top surface of semiconductor substrate 1, and STI region 7b. Ditch region 8, shown schematically in FIG. 6, can be a site where possible contaminants, such as organic solutions used for subsequent clean procedures, reside, perhaps resulting in reliability or yield loss. In addition, subsequently deposited layers, such as polysilicon or metal, can experience difficulties contouring the unwanted topography of ditch 8, thus resulting in yield problems.

Figure 7:
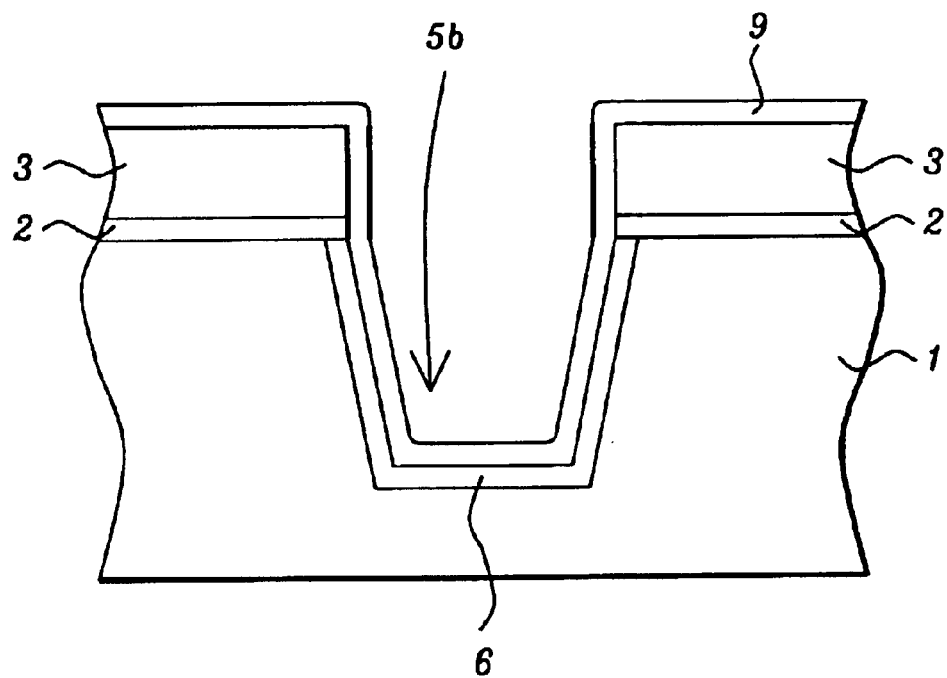
Figure 8:
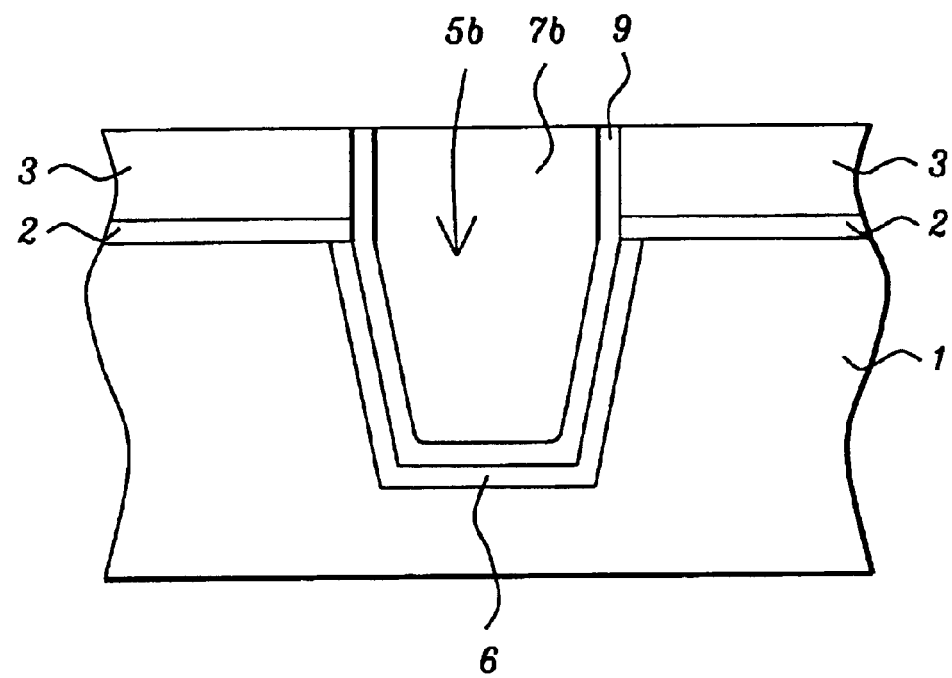

A solution to the formation of ditch region 8, via use of a protective, silicon rich silicon oxide layer, will now be addressed, and schematically described using FIGS. 7–10. Referring back to FIG. 3, after formation of silicon dioxide liner layer 6, silicon oxide layer 9, is now deposited. Silicon oxide layer 9, is a silicon rich, silicon oxide layer, obtained via PECVD procedures, however featuring an absence of the RF bias usually used with the PECVD procedure. The omission of the RF bias allows silicon oxide layer 9, to be deposited with unique features, which will offer protection from a subsequent BHF procedure used to remove silicon dioxide pad layer 2. The non-bias PECVD procedure, is performed using an oxygen to silane ratio of between about 1.35 to 1, compared to non-biased PECVD silicon oxide counterparts deposited using a oxygen to silane ratio of between about 3.8 to 1. This results in a refractive index for the silicon rich, silicon oxide layer of between about 1.60 to 1.70, compared to non-biased PECVD, and higher oxygen to silane ratio counterparts, deposited with a refractive index between about 1.45 to 1.50. Of upmost importance is the low etch rate of silicon rich, silicon oxide layer 9, between about 750 to 850 Angstroms/min in a 10:1 BHF solution, compared to conventionally deposited PECVD silicon oxide counterparts exhibiting an etch rate between about 1100 to 1200 in the same etchant. The thickness of silicon rich, silicon oxide layer 9, shown schematically in FIG. 7, is between about 100 to 500 Angstroms.

Insulator layer 7a, comprised of CVD silicon oxide, obtained using silane and $N_2O$ as reactants, is again deposited at a thickness between about 5000 to 7000 Angstroms, completely filling shallow trench shape 5b. This is schematically shown in FIG. 7. A CMP procedure is then employed to remove portions of insulator layer 7a, as well as the portions of silicon rich, silicon oxide layer 9, from the top surface of silicon nitride layer 3, again resulting in STI regions 7b, shown schematically in FIG. 8. However in this case, silicon rich, silicon oxide layer 9, envelops STI region 7b.

FIG. 9, schematically shows the result of the selective removal of silicon nitride layer 3, again via use of a hot phosphoric acid solution. STI region 7b, covered by silicon rich, silicon oxide layer 9, will now be protected from the subsequent BHF procedure, used to remove silicon dioxide pad layer 2. The result of the 50:1 BHF procedure is schematically shown in FIG. 10. In addition to the protection of the top portion, or the portion of STI region 7b, offered by silicon rich, silicon oxide layer 9, only minima exposure of the BHF procedure is experienced at the top edge of silicon oxide liner layer 6. This results in only slight "gouging" or "ditching" of silicon oxide liner layer 6, creating ditch region 10, which is less extensive than ditch region 8, (previously shown in FIG. 6), which propagating into STI region 7b. Silicon rich, silicon oxide layer 9, protected STI region 7b, from a more extensive gouging effect.

FIG. 11, in a tabular format, compares the properties of the silicon rich, silicon oxide layer to properties of a thermally grown silicon dioxide layer. Silicon rich, silicon oxide layers, obtained via PECVD procedures, without the use of an RF bias, and with reactant ratio of oxygen to silane of about 1.4 to 1, exhibits a re five index of about 1.66, and most importantly exhibits an etch rate in !0:1 BHF solution of between about 750 to 850 Angstroms/min. In contrast, PECVD silicon oxide layers, formed with an RF bias, and using an oxygen to silane ratio between about 3.8 to 1, results in films exhibiting a refractive index of about 1.46, and an etch rate in 10:1 BHF between about 1100 to 1200 Angstroms/min. Therefore the reduced etch rate of the silicon rich, silicon oxide layer, afforded greater protection of the STI regions to BHF exposure, when compared to possible counterpart silicon oxide layers used for the same objective.

While this invention has been particularly shown and described with reference to, the preferred embodiments thereof, it will be understood by those skilled in the art that various changes in form and details may be made without departing from the spirit and scope of this invention.

What is claimed is:

1. A method of forming a shallow trench isolation (STI) region, in a semiconductor substrate, comprising the steps of:

forming an opening in a composite insulator layer, comprised of an overlying silicon nitride layer and of an underlying first silicon oxide layer, exposing a portion of a top surface of said semiconductor substrate;

forming a shallow trench shape in a top portion of said semiconductor substrate, using said opening in said composite insulator layer as a mask;

growing a second silicon oxide layer on exposed surfaces of said shallow trench shape;

depositing a third silicon oxide layer on said second silicon oxide layer, and on a top surface of said composite insulator layer;

depositing a fourth silicon oxide layer, completely filling said shallow trench shape;

removing portions of said fourth silicon oxide layer, and portions of said third silicon oxide layer, from the top surface of said composite insulator layer, resulting in a definition of said STI region, with said STI region comprised of a bottom STI shape embedded in said top portion of said semiconductor substrate, featuring a fourth silicon oxide fill located between sidewalls comprised of said third silicon oxide layer on said second silicon oxide layer, and with said STI region comprised with a top STI shape, embedded in said composite insulator layer, and featuring said fourth silicon oxide fill covered by sidewalls of said third silicon oxide layer;

selectively removing said silicon nitride layer of said composite insulator layer; and removing said first silicon oxide layer of said composite insulator layer via use of a 10:1 buffered hydrofluoric acid solution which etches said third silicon oxide layer at an etch rate of about 750 to 850 Angstroms/min, allowing removal of said first silicon oxide layer while resulting in sidewalls of said third silicon oxide layer remaining on sides of said top STI shape.

2. The method of claim 1, wherein said first silicon oxide layer, of said composite insulator layer, is a silicon dioxide layer, thermally grown in an oxygen-steam ambient at a temperature between about 900 to 1000° C., at a thickness between about 100 to 250 Angstroms.

3. The method of claim 1, wherein said silicon nitride layer, of said composite insulator layer, is obtained via LPCVD or PECVD procedures, at a thickness between about 1100 to 1700 Angstroms.

4. The method of claim 1, wherein a diameter of said opening in said composite insulator layer, is between about 0.15 to 0.30 um.

5. The method of claim 1, wherein a depth of said shallow trench shape, in said semiconductor substrate, is between about 2500 to 5000 Angstroms.

6. The method of claim 1, wherein said second silicon oxide layer, is a silicon dioxide layer, obtained at a thickness between about 100 to 300 Angstroms, via thermal oxidation procedures performed in an oxygen-steam ambient, at a temperature between about 950 to 100° C.

7. The method of claim 1, wherein said third silicon oxide layer is a silicon rich, silicon oxide layer, obtained at a thickness between about 100 to 500 Angstroms, via PECVD procedures, performed without an RF bias, and using a reactant ratio of oxygen to silane between about 1.35 to 1.40, to 1.

8. The method of claim 1, wherein a refractive index of said third silicon oxide layer is between about 1.60 to 1.70.

9. The method of claim 1, wherein said fourth silicon oxide layer, used to completely fill said shallow trench shape, is a silicon oxide layer, obtained via PECVD or LPCVD procedures, at a thickness between about 5000 to 7000 Angstroms, using silane and $N_2O$ as reactants.

10. The method of claim 1, wherein removal of said fourth silicon oxide layer, and of said third silicon oxide layer, forming said STI region, is accomplished via a chemical mechanical polishing (CMP) procedure.

11. The method of claim 1, wherein said second silicon oxide layer is removed via use of a 50:1 BHF solution.

12. A method of forming an STI region in a semiconductor substrate, comprising the steps of:

growing a silicon dioxide pad layer on a surface of said semiconductor substrate;

depositing a silicon nitride layer;

forming an opening in said silicon nitride layer, and in said silicon dioxide pad layer, exposing a portion of a top surface of said semiconductor substrate;

forming a shallow trench shape in a top portion of said semiconductor substrate, using said opening in said silicon nitride layer, and in said silicon dioxide pad layer as a mask;

growing a silicon dioxide liner layer on exposed sides of said shallow trench shape;

depositing a silicon rich, silicon oxide layer on a top surface of said silicon nitride layer, on sides of said opening in said silicon nitride layer and in said silicon dioxide pad layer, and on sides of said shallow trench shape;

depositing a silicon oxide layer completely filling said shallow trench shape, and said opening in said silicon nitride layer and in said silicon dioxide pad layer;

performing a chemical mechanical polishing procedure to remove portions of said silicon oxide layer and portions of said silicon rich, silicon oxide layer, from the top surface of said silicon nitride layer, resulting in said STI region comprised of a top STI portion located in said opening in said silicon nitride layer and in said silicon dioxide pad layer, and embedded by a silicon rich, silicon oxide spacer, and comprised of a bottom STI portion, located in said shallow trench shape, embedded by a composite spacer of an overlying silicon rich, silicon oxide component, and an underlying silicon dioxide liner component;

selectively removing said silicon nitride layer exposing said silicon dioxide pad layer; and performing a buffered hydrofluoric acid procedure to selectively remove said silicon dioxide pad layer, wherein an etch rate of said silicon rich, silicon oxide layer in a 10:1 buffered hydrofluoric acid solution is between about 750 to 850 Angstrom/min allowing said silicon dioxide pad layer to be removed without removing silicon rich, silicon oxide spacer located on sides of top STI portion.

13. The method of claim 12, wherein said silicon dioxide pad layer is thermally grown in an oxygen-steam ambient at a temperature between about 900 to 1000° C., to a thickness between about 100 to 250 Angstroms.

14. The method of claim 12, wherein said silicon nitride layer is obtained via LPCVD or PECVD procedures, at a thickness between about 1100 to 1700 Angstroms.

15. The method of claim 12, wherein a diameter of said shallow trench shape in said opening in said silicon nitride layer, and in said silicon dioxide pad layer, is between about 0.15 to 0.30 um.

16. The method of claim 12, wherein a depth of said shallow trench shape, in said semiconductor substrate, is between about 2500 to 5000 Angstroms.

17. The method of claim 12, wherein said silicon dioxide liner layer is obtained at a thickness between about 100 to 300 Angstroms, via thermal oxidation procedures performed in an oxygen-steam ambient, at a temperature between about 950 to 1100° C.

18. The method of claim 12, wherein said silicon rich, silicon oxide layer is obtained at a thickness between about 100 to 500 Angstroms, via PECVD procedures, without the use of an RF bias, using a ratio of oxygen to silane between about 1.35 to 1.40, to 1.

19. The method of claim 12, wherein a refractive index of said silicon rich, silicon oxide layer is between about 1.60 to 1.70.

20. The method of claim 12, wherein said silicon oxide layer, used to completely fill said shallow trench shape, is obtained via PECVD or LPCVD procedures, at a thickness between about 5000 to 7000 Angstroms, using silane and $N_2O$ as reactants.

21. The method of claim 15, wherein said silicon nitride layer is selectively removed via the use of a phosphoric acid solution.

* * * * *